United States Patent
Yang et al.

(10) Patent No.: US 8,836,018 B2
(45) Date of Patent: Sep. 16, 2014

(54) SEMICONDUCTOR INTEGRATED DEVICE WITH CHANNEL REGION

(71) Applicant: Taiwan Semiconductor Manufacturing Company, Ltd., Hsin-Chu (TW)

(72) Inventors: Kai-Chieh Yang, Zhubei (TW);
Wei-Hao Wu, Hsinchu (TW);
Wen-Hsing Hsieh, Hsinchu (TW);
Zhiqiang Wu, Chubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/678,977

(22) Filed: Nov. 16, 2012

(65) Prior Publication Data

US 2014/0138763 A1    May 22, 2014

(51) Int. Cl.
*H01L 29/66* (2006.01)
*H01L 29/78* (2006.01)

(52) U.S. Cl.
CPC ...... *H01L 29/7827* (2013.01); *H01L 29/66666* (2013.01)
USPC .......................................................... 257/329

(58) Field of Classification Search
USPC .......... 257/213–413, E21.453, 900, 902–903,
257/E21.19–E21.21, E21.394–E21.458,
257/E21.615–E21.694, E21.444,
257/E29.049–E29.067, E29.237, E29.256,
257/E29.299, E21.428–E21.43, E21.618,
257/E21.634, E21.431–E21.435,
257/E21.619–E21.62, E29.325–E29.346,
257/465; 438/183, 926, 135, 142
See application file for complete search history.

(56) References Cited

U.S. PATENT DOCUMENTS

| | | | |
|---|---|---|---|
| 2002/0037619 A1* | 3/2002 | Sugihara et al. | 438/289 |
| 2009/0065809 A1* | 3/2009 | Yamakawa | 257/190 |
| 2009/0302412 A1* | 12/2009 | Cheng et al. | 257/506 |
| 2011/0049613 A1* | 3/2011 | Yeh et al. | 257/327 |

* cited by examiner

*Primary Examiner* — Dao H Nguyen
*Assistant Examiner* — Tram H Nguyen
(74) *Attorney, Agent, or Firm* — Haynes and Boone, LLP

(57) ABSTRACT

A method of fabricating a semiconductor integrated circuit (IC) is disclosed. The method includes receiving a semiconductor device precursor. The semiconductor device precursor includes a substrate, source/drain regions on the substrate, dummy gate stacks separating the source/drain regions on the substrate and a doped region under the dummy gate stacks. The dummy gate stack is removed to form a gate trench. The doped region in the gate trench is recessed to form a channel trench. A channel layer is deposited in the channel trench to form a channel region and then a high-k (HK) dielectric layer and a metal gate (MG) are deposited on the channel region.

18 Claims, 7 Drawing Sheets

SEMICONDUCTOR INTEGRATED DEVICE WITH CHANNEL REGION

BACKGROUND

The semiconductor integrated circuit (IC) industry has experienced exponential growth. Technological advances in IC design and material have produced generations of ICs where each generation has smaller and more complex circuits than previous generation. In the course of IC evolution, functional density (i.e., the number of interconnected devices per chip area) has generally increased while geometry size (i.e., the smallest component (or line) that can be created using a fabrication process) has decreased.

Complementary Metal Oxide Semiconductor (CMOS) devices have typically been formed with a gate oxide and polysilicon gate electrode. There has been a desire to replace the gate oxide and polysilicon gate electrode with a high-k gate dielectric and a metal gate electrode to improve device performance as feature sizes continue to decrease. Integration issues often occur when high temperature processes are performed, especially for a metal gate. It is desired to have improvements in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
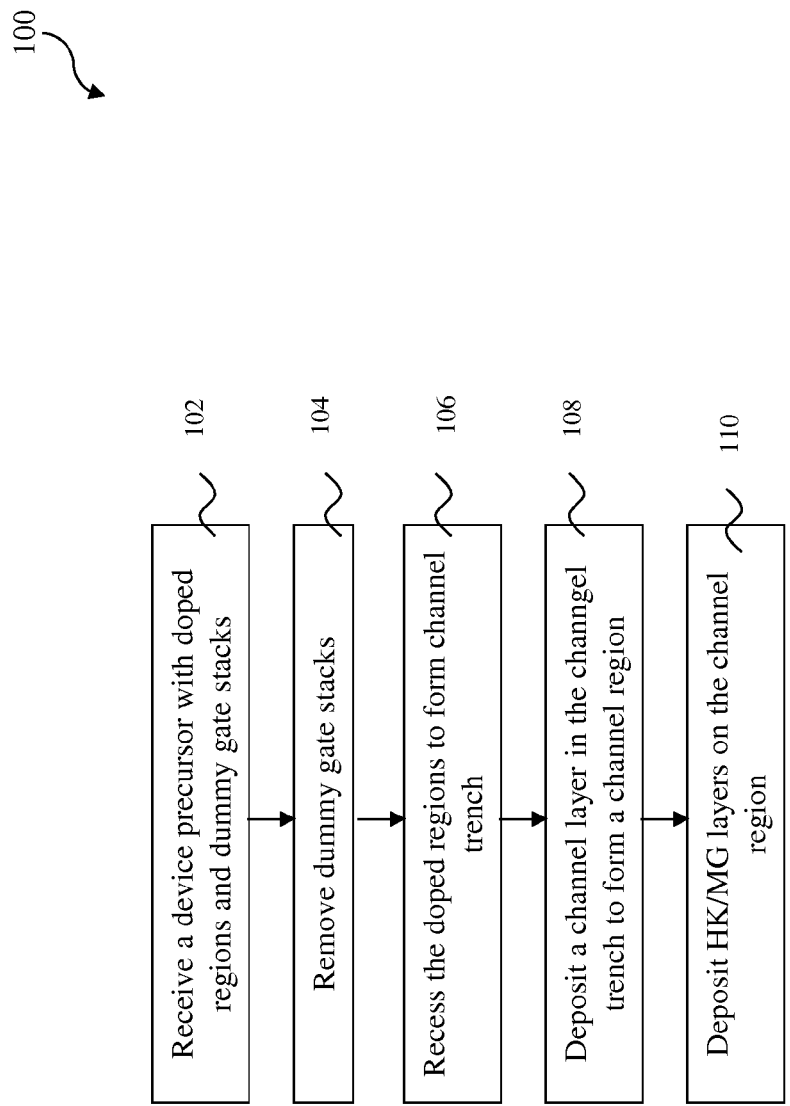
FIG. 1 is a flowchart of an example method for fabricating a semiconductor integrated circuit (IC) constructed according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a flowchart of one embodiment of a method 100 of fabricating one or more semiconductor devices according to aspects of the present disclosure. The method 100 is discussed in detail below, with reference to a semiconductor device 500 shown in FIGS. 2 to 7 for the sake of example. It is understood that additional steps can be provided before, during, and after the method, and some of the steps described can be replaced or eliminated for other embodiments of the method.

Figure 2:
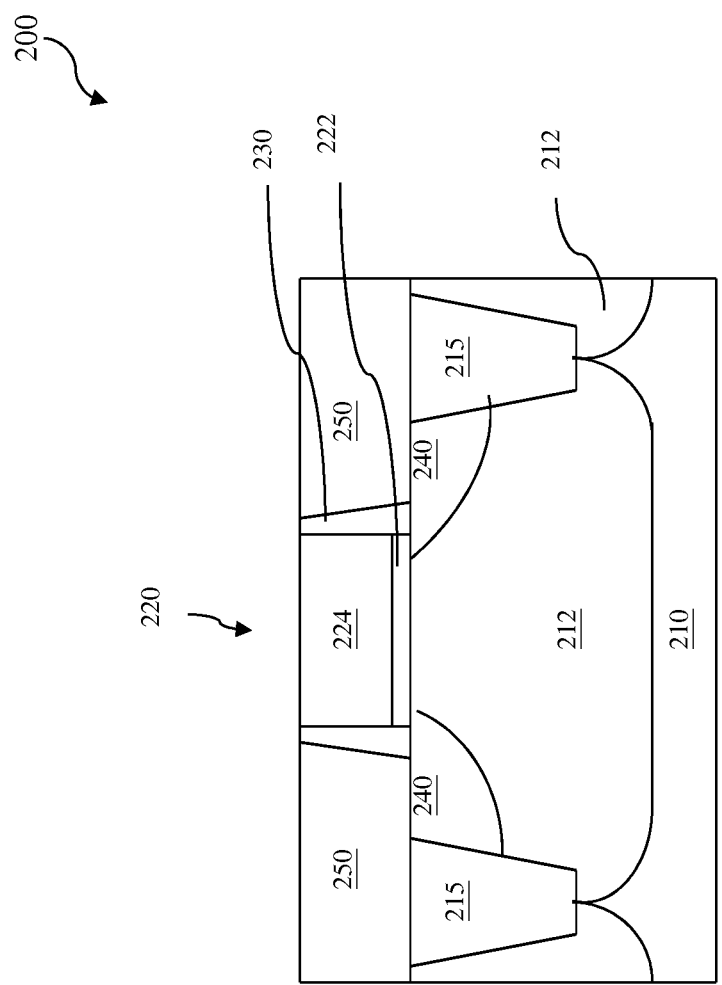
FIGS. 2 to 7 are cross-sectional views of an example semiconductor integrated circuit (IC) at fabrication stages constructed according to the method of FIG. 1.

Referring to FIGS. 1 and 2, the method 100 begins at step 102 by receiving a semiconductor device precursor 200. The semiconductor device precursor 200 includes a substrate 210. The substrate 210 includes silicon. In alternative embodiments, the substrate may include germanium, silicon germanium, gallium arsenide or other appropriate semiconductor materials. Alternatively and for some embodiments, the substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate 210 may include a buried dielectric layer such as a buried oxide (BOX) layer, such as that formed by a method referred to as separation by implantation of oxygen (SIMOX) technology, wafer bonding, SEG, or other appropriate methods. In fact various embodiments may include any of a variety of substrate structures and materials.

The semiconductor device precursor 200 may also include a doped region 212 such as a P-well or an N-well, which may be formed by implantation techniques. In the present embodiment, a portion of the substrate 210 is doped P-type to form the P-well 212, where an n-channel device will be fabricated. The doped region 212 is doped with P-type dopants, such as boron or BF2. The doped region 212 may be formed directly on the substrate 210, in a P-well structure, in an N-well structure, in a dual-well structure, or using a raised structure.

The semiconductor device precursor 200 may also include various isolation features 215. The isolation features 215 separate various device regions in the substrate 210. The isolation features 215 include different structures formed by using different processing technologies. For example, the isolation features 215 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 215.

In present embodiment, the semiconductor device precursor 200 also includes one or more dummy gate stacks 220 formed on top of a portion of the doped region 212. The dummy gate stacks 220 are to be replaced later by a high-k (HK) and metal gate (MG) after high thermal temperature processes are performed, such as thermal processes during sources/drains formation. The dummy gate stack 220 may include a dielectric layer 222 and a polysilicon layer 224. The dummy gate stack 220 is formed by any suitable process or processes. For example, the gate stack 220 can be formed by a procedure including deposition, photolithography patterning, and etching processes. The deposition processes include chemical vapor deposition (CVD), physical vapor deposition (PVD), atomic layer deposition (ALD), other suitable methods, and/or combinations thereof. The photolithography patterning processes include photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods (e.g., reactive ion etching). The dielectric layer 222 includes silicon oxide, silicon nitride, or any other suitable materials.

The semiconductor device precursor 200 also includes sidewall spacers 230 formed on the sidewalls of the gate stacks 220. The sidewall spacers 230 may include a dielectric material such as silicon oxide. Alternatively, the sidewall spacers 230 may include silicon nitride, silicon carbide, silicon oxynitride, or combinations thereof. The sidewall spacers 230 may be formed by deposition and dry etching processes known in the art.

The semiconductor device precursor 200 also includes source/drain (S/D) regions 240 in the substrate 210, separated by the dummy gate stacks 220. The S/D regions 240 are formed by a proper technique, such as one or more ion implantations. The S/D regions 240 may further include lightly doped (LDD) and heavily doped regions. After the formation of the source and drain (S/D) regions 240, one or more annealing processes may be performed. The annealing processes may include rapid thermal anneal (RTA), laser anneal, or other suitable annealing processes. As an example, a high-temperature thermal anneal step that may apply temperatures anywhere in the range of 900 C-1100 C, though other embodiments may use temperatures within a different range. As another example, high-temperature anneal includes a "spike" annealing process that has a very short time duration.

In one embodiment, S/D features may be formed in the S/D regions 240. For example, by recessing a portion of the semiconductor substrate 210 to form S/D recessing trenches and epitaxially growing a semiconductor material layer in the S/D recessing trenches. The semiconductor material layer includes element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). The epitaxial processes include CVD deposition techniques (e.g., vapor-phase epitaxy (VPE) and/or ultra-high vacuum CVD (UHV-CVD)), molecular beam epitaxy, and/or other suitable processes. The S/D features may be formed by one or more epitaxy or epitaxial (epi) processes. The S/D features may be in-situ doped during the epitaxy process. In one embodiment, the source/drain features are not in-situ doped, an implantation process (i.e., a junction implant process) is performed to dope the S/D features. One or more annealing processes may be performed to activate source/drain epitaxial feature. The annealing processes comprise rapid thermal annealing (RTA) and/or laser annealing processes.

The semiconductor device precursor 200 also includes an interlayer dielectric (ILD) layer 250 on the substrate 210. The ILD layer 250 includes silicon oxide, oxynitride or other suitable materials. The ILD layer 250 includes a single layer or multiple layers. The ILD layer 250 is formed by a suitable technique, such as CVD, ALD and spin-on (SOG). The ILD layer 250 fills in gaps between the gate stacks 220. A CMP process may be performed to remove the excess ILD layer 250. A depth of the CMP is controlled such that the dummy polysilicon gate 224 is exposed.

Figure 3:
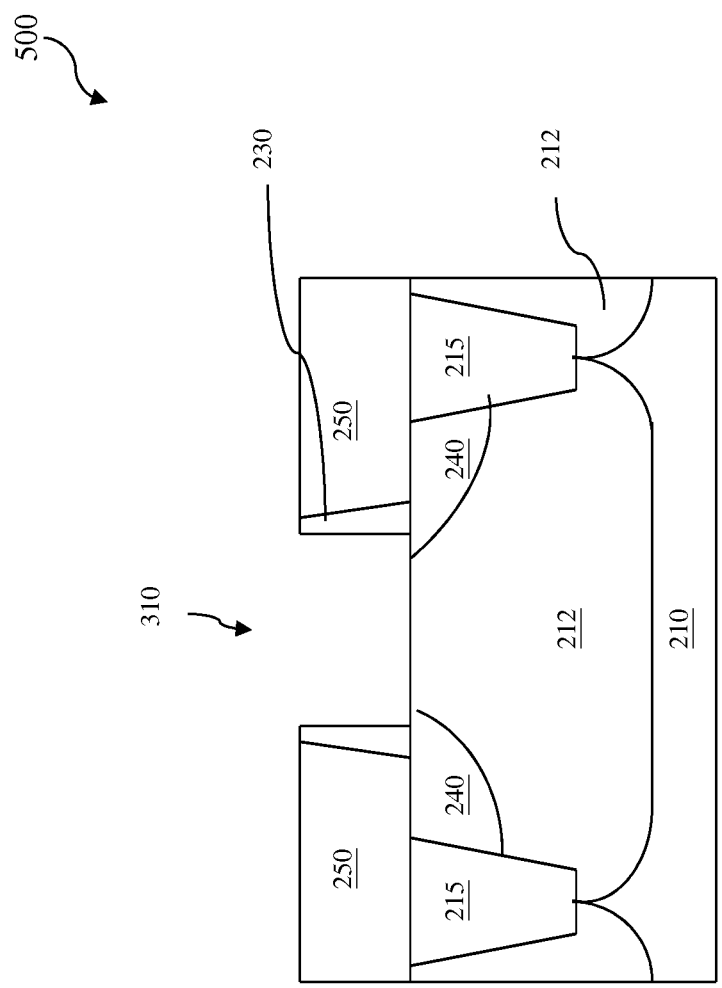

Referring FIGS. 1 and 3, once the semiconductor device precursor 200 is received, the method 100 proceeds to step 104 by removing the dummy gate stacks 220 to form a gate trench 310 and expose a portion of the doped region 212. The dummy gate stacks 220 may be removed by lithography patterning and etch processes. Alternatively, the dummy gate stacks 220 may be removed by a selective wet etch or a selective dry etch. In one embodiment, additionally, an ion-implantation (IMP) is performed to the doped region 212 through the gate trench 310 by using the sidewall spacers 230 and the ILD 250 as an IMP mask.

Figure 4:
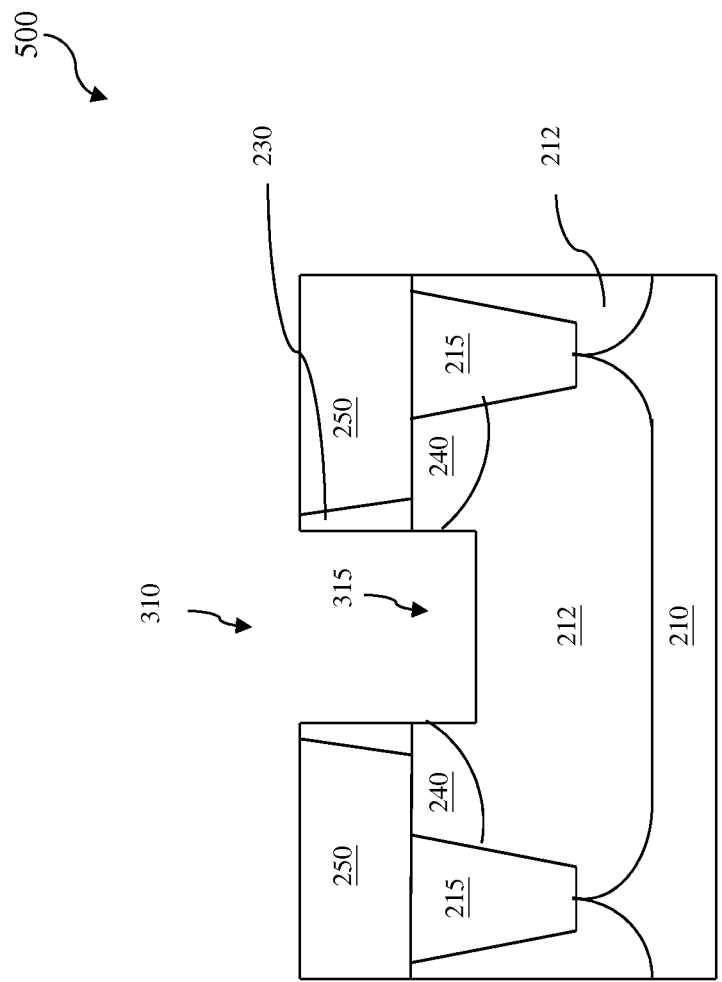

Referring to FIGS. 1 and 4, the method 100 proceeds to step 106 by recessing the doped region 212 in the gate trench 310 to form a channel trench 315. The recessing process may also include a selective wet etch or a selective dry etch. For example, the wet etching solution may include a tetramethylammonium hydroxide (TMAH), a HF/HNO3/CH3COOH solution, or other suitable solution. For another example, the dry etching processes may include a biased plasma etching process that uses a chlorine-based chemistry. A predetermined depth (d) of the channel trench may be controlled by the recessing process, such as etching time.

Figure 5B:
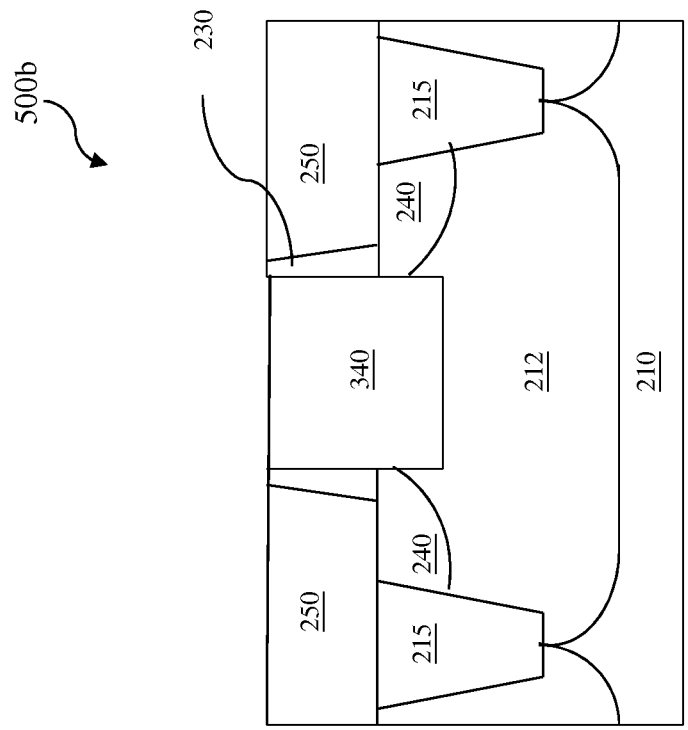
Figure 5A:
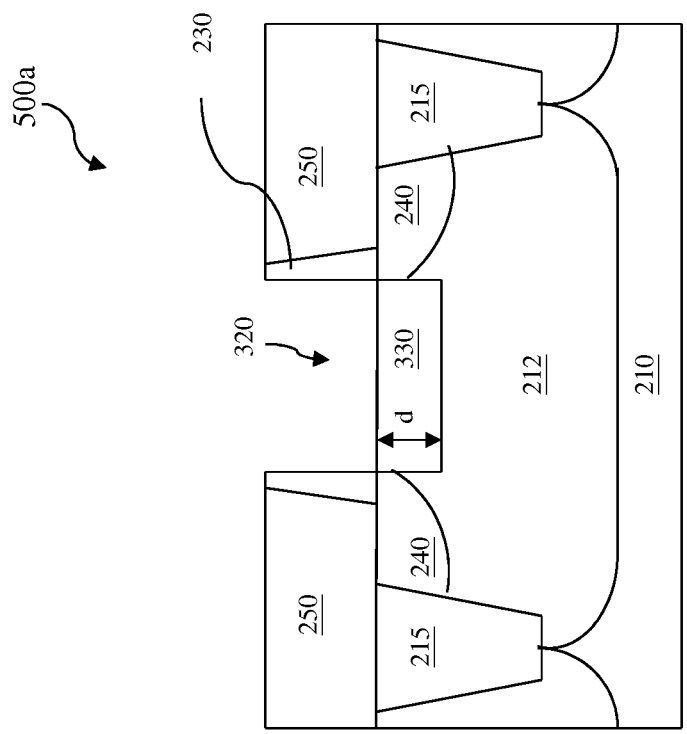

Referring to FIGS. 1 and 5a, the method 100 proceeds to step 108 by forming a channel region 320 in the channel trench 315. In the present embodiment, the channel region 320 is formed after sources/drains thermal processes being performed. In one embodiment, the channel region 320 is formed by epitaxially growing a channel layer 330 to fill in the channel trench 315 with a thickness, which is substantially same as d. As a result, a top surface of the channel layer 330 is about the same as a top surface of the substrate 210.

The channel layer 330 includes Ge, Si, GaAs, SiGe, GaAsP, semiconductor materials of Group III-V or any other suitable materials. The channel layer 320 may be deposited by epitaxial processes, such as CVD molecular beam epitaxy, and/or other suitable processes.

Referring to FIGS. 1 and 5b, in another embodiment, the channel region 320 is formed by first depositing material 340 for the channel layer to fill the channel trench 315 and the gate trench 310 (FIG. 4). In some embodiments, excess material 340 may overflow the gate trench 310, and a chemical-mechanical polishing process (CMP) may be used to remove the excess material, leaving a planar top surface as shown in FIG. 5b. Afterwards, an etch-back process is performed to remove additional material 340, until it reaches a thickness d, by controlling one or more the etch-back process parameters, such as etch time. As a result, a channel layer is formed that is similar to the channel layer 330 shown in FIG. 5a. Going forward, reference to the channel layer 330 of FIG. 5a can refer to a channel layer formed by either process (FIG. 5a or 5b).

Figure 6:
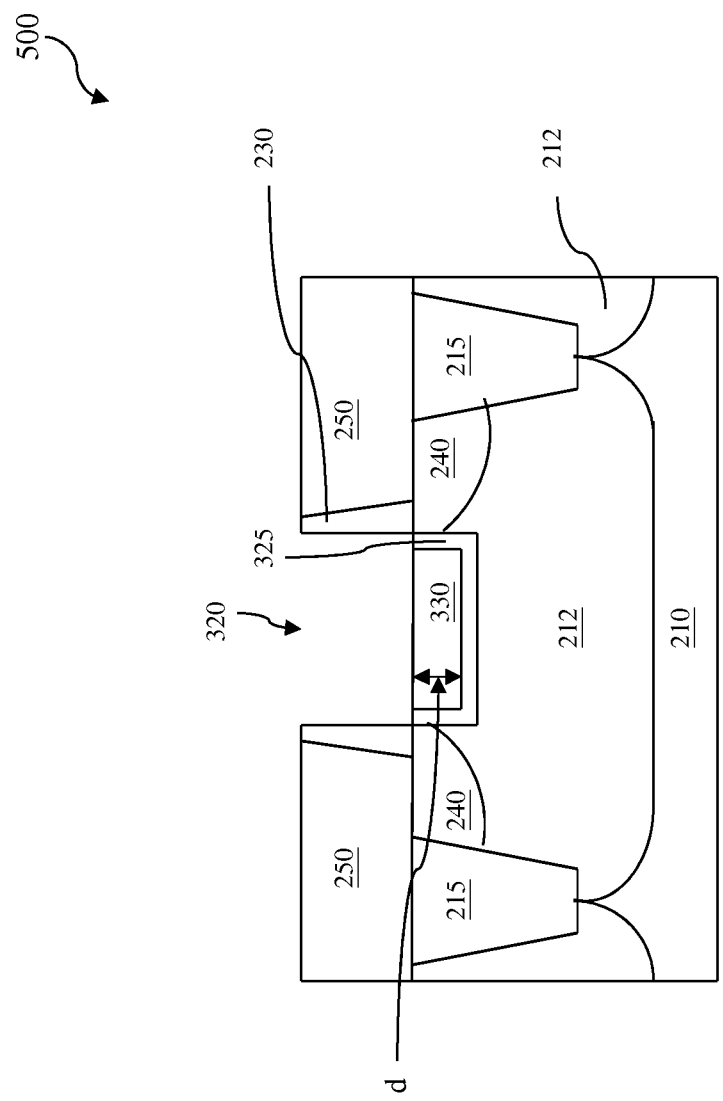

Referring to FIG. 6, in yet another embodiment, prior to forming the channel layer 330, a back-diffusion barrier layer 325 is deposited in the channel trenches 315 by an epitaxial growth process. The back-diffusion barrier layer 325 includes semiconductor materials such as SiC and SiGe, or any other suitable semiconductor materials of Group IV and Group III-IV. In yet another embodiment, the back-diffusion barrier layer 325 is deposited by an in-situ doped epitaxial process. Afterwards, the channel layer 330 is formed by one of the above-described processes.

Figure 7:
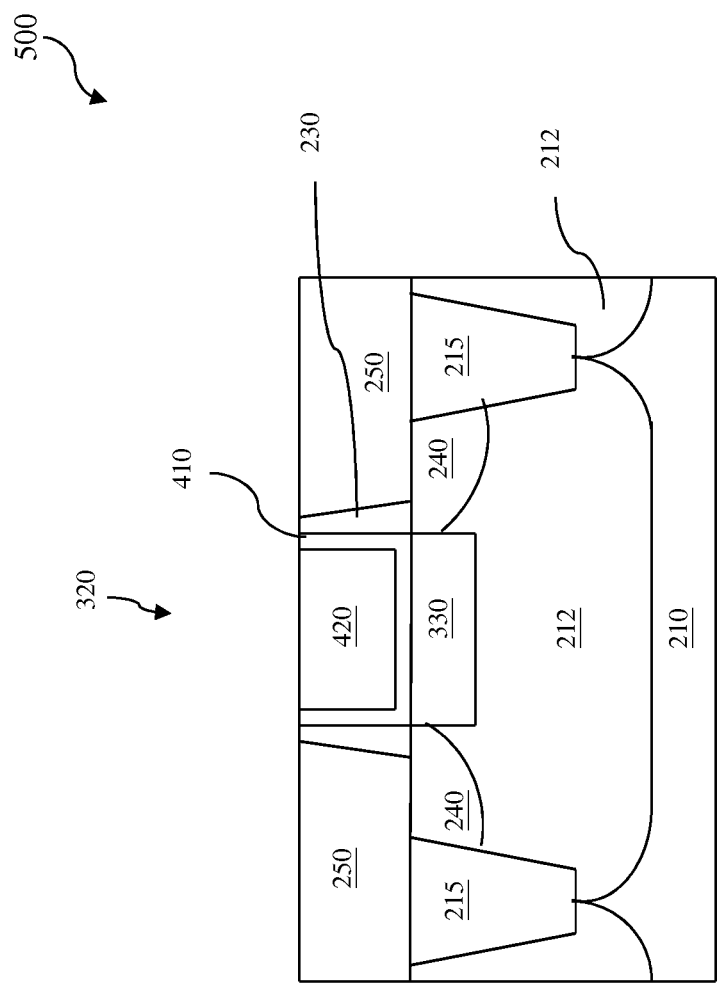

Referring to FIGS. 1 and 7, the method 100 proceeds to step 110 by depositing a gate dielectric layer 410 and metal gate (MG) 420 on the substrate 210, including the channel region 320. The gate dielectric layer 410 may include an interfacial layer (IL) deposited by any appropriate method, such as atomic layer deposition (ALD), chemical vapor deposition CVD and ozone oxidation. The IL includes oxide, HfSiO and oxynitride. The gate dielectric layer 410 may also include a high-k (HK) dielectric layer deposited on the IL by suitable techniques, such as ALD, CVD, metalorganic CVD (MOCVD), physical vapor deposition (PVD), thermal oxidation, combinations thereof, or other suitable techniques. The HK dielectric layer may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable materials.

The MG 420 may include a single layer or multi layers, such as a metal layer, a liner layer, a wetting layer, and an adhesion layer. The MG 420 may include Ti, Ag, Al, TiAlN, TaC, TaCN, TaSiN, Mn, Zr, TiN, TaN, Ru, Mo, Al, WN, Cu, W, or any suitable materials. The MG 420 may be formed by ALD, PVD, CVD, or other suitable process. A CMP may be performed to remove excessive MG 420. The CMP process may have a high selectivity of metal layers selectivity with respect to the ILD layer 270. The CMP provides a substantially planar top surface for the metal gate 420 and the ILD layer 250.

Additional steps can be provided before, during, and after the method 100, and some of the steps described can be replaced, eliminated, or moved around for additional embodiments of the method 100.

The semiconductor device 500 may include additional features, which may be formed by subsequent processing. For example, various contacts/vias/lines and multilayer interconnect features (e.g., metal layers and interlayer dielectrics) may be formed over the substrate, configured to connect the various features or structures of the semiconductor device 500. For example, a multilayer interconnection includes vertical interconnects, such as conventional vias or contacts, and horizontal interconnects, such as metal lines. The various interconnection features may implement various conductive materials including copper, tungsten, and/or silicide.

Based on the above, it can be seen that the present disclosure offers methods for fabricating a HK/MG device. The method employs a channel region last process scheme to avoid dopant related activation thermal processes after the channel region formation. The method demonstrates reducing random dopant fluctuation (RDF). The method offers a locally selective epitaxial growth channel region to gain channel mobility. The method also provides process flexibility to employ an embedded back-diffusion barrier layer formation beneath the channel region and perform a channel region ion-implantation (IMP) with sidewall spacers as an self-IMP-mask.

The present disclosure provides many different embodiments of fabricating a semiconductor IC that provide one or more improvements over existing approaches. In one embodiment, a method for fabricating a semiconductor integrated circuit (IC) includes receiving a semiconductor device precursor. The semiconductor device precursor includes a substrate, source/drain regions on the substrate, dummy gate stacks separating the source/drain regions on the substrate and a doped region under the dummy gate stacks. The method also includes removing the dummy gate stacks to form a gate trench, recessing the doped region in the gate trench to form a channel trench, depositing a channel layer in the channel trench to form a channel region and depositing a high-k (HK) dielectric layer and a metal gate (MG) layer on the channel region.

In another embodiment, a method for fabricating a semiconductor IC includes receiving a semiconductor device precursor. The semiconductor device precursor includes a substrate, source/drain regions on the substrate, dummy gate stacks separating the source/drain regions on the substrate, a doped region under the dummy gate stacks on the substrate and sidewall spacers along sides of the dummy gate tacks on the substrate. The method also includes removing the dummy gate to form a gate trench, recessing the doped region in the gate trench to form a channel trench, epitaxially growing a channel layer to fill in the channel trench to form a channel region and depositing a high-k (HK) dielectric layer and a metal gate (MG) on the channel region.

In yet another embodiment, a method for fabricating a semiconductor IC includes receiving a semiconductor device precursor. The semiconductor device precursor includes a substrate, source/drain regions on the substrate, dummy gate stacks separating the source/drain regions, a doped region under the dummy gate stacks on the substrate and sidewall spacers on the dummy gate stack. The method also includes after source/drain thermal processes, removing the dummy gate stack to form a gate trench, recessing the doped region in the gate trench to form a channel trench with a depth (d), depositing a back-diffusion barrier layer, formed by one or more semiconductor materials from the group consisting of Group V and Group III-V, on the channel trench, epitaxially growing a channel layer on the back-diffusion barrier layer to fill in the channel trench, etching back the channel layer to a thickness such that it is substantially same as d to form a channel region and depositing a high-k (HK) dielectric layer and a metal gate (MG) on the channel region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor integrated circuit (IC), the method comprising:
   receiving a semiconductor device precursor, the semiconductor device precursor including:
   a substrate; source/drain regions on the substrate; a dummy gate stack separating the source/drain regions on the substrate; and
   a doped region in the substrate and under the dummy gate stack;
   removing the dummy gate stack to form a gate trench;
   performing an ion-implantation (IMP) to the doped region in the substrate and exposed in the gate trench;
   recessing the doped region exposed in the gate trench to form a channel trench; forming a channel layer in the channel trench; and depositing a high-k (HK) dielectric layer and a metal gate (MG) over the channel layer, prior to depositing the channel layer, depositing a back-diffusion barrier layer on the channel trench, wherein the back-diffusion barrier layer is extended on a sidewall of the channel trench to a bottom of the channel trench.

2. The method of claim 1, wherein the channel layer includes one or more semiconductor materials from the group consisting of germanium, silicon germanium and Group III-V.

3. The method of claim 1, wherein the channel layer is formed by an epitaxial growth process.

4. The method of claim 3, wherein a top surface of the channel layer is substantially coplanar with a top surface of the substrate.

5. The method of claim 1, wherein the doped region is recessed to a predetermined depth (d) by an etch process.

6. The method of claim 5, wherein the channel layer is formed by a deposition process.

7. The method of claim 5, wherein the channel region is formed by filling the channel trench and at least a portion of the gate trench with a channel material, and then etching back the channel material to a thickness such that it is substantially same to d.

8. The method of claim 1, further comprising:
performing a thermal process on the source/drain regions prior to forming the channel layer.

9. The method of claim 1, wherein the back-diffusion barrier layer includes one or more semiconductor materials from the group consisting of Group IV and Group III-V.

10. The method of claim 1, the semiconductor device precursor further includes:
sidewall spacers formed along sidewalls of the dummy gate stack; and
an interlayer dielectric (ILD) layer deposited adjacent to the dummy gate stack and on side of the sidewall spacers.

11. The method of claim 10, wherein the sidewall spacers and the ILD layer serve as masks for the ion-implantation (IMP) performed to the doped region through the gate trench.

12. A method for fabricating a semiconductor integrated circuit (IC), the method comprising:
forming a doped region in a semiconductor substrate;
forming a gate trench above the doped region;
recessing the doped region exposed in the gate trench to form a channel trench, the channel trench having a top surface below a top surface of the semiconductor substrate;
filling the channel trench and the gate trench with a channel material;
removing the channel material disposed in the gate trench so that the channel material is substantially coplanar with the top surface of the semiconductor substrate; and
forming a high-k/metal gate structure in the gate trench, above the filled channel trench,
prior to filling the channel trench and the gate trench with the channel material, depositing a back-diffusion barrier layer in the channel trench,
wherein the back-diffusion barrier layer is extended on a sidewall of the channel trench to a bottom of the channel trench.

13. The method of claim 12, further comprising:
forming source/drain regions in the semiconductor substrate;
performing one or more thermal processes on the source/drain regions prior to filling the channel trench with the channel material.

14. The method of claim 12, wherein the channel material is selected from the group consisting of Group V and Group III-V materials.

15. The method of claim 12, wherein the channel trench is filled using an epitaxial growth process.

16. A semiconductor integrated circuit (IC) device, comprising:
a substrate comprising a first semiconductor material;
a doped region in the substrate;
a source region and a drain region in the doped region;
a channel region formed in the doped region and between the source and drain regions, the channel region including a back-diffusion barrier layer and a channel layer formed on the back-diffusion barrier layer;
a high-k (HK) dielectric layer formed at least partially over the channel region; and
a metal gate (MG) formed over the HK dielectric layer,
wherein the channel layer includes a second semiconductor material, and the second semiconductor material includes one or more materials selected from the group consisting of GaAs, GaAsP, a semiconductor material of Group III-V, and a combination thereof,
wherein the back-diffusion barrier layer is extended on a sidewall of the channel trench to a bottom of the channel trench.

17. The method of claim 1, wherein the recessing the doped region exposed in the gate trench to form the channel trench includes etching the doped region with one or more solutions selected from the group consisting of a tetramethylammonium hydroxide (TMAH) solution, a $HF/HNO_3/CH_3COOH$ solution, and a combination thereof.

18. The method of claim 12, further comprising:
prior to removing the channel material disposed in the gate trench, performing a chemical-mechanical polishing (CMP) process to remove excessive channel material and to provide a planar top surface.

* * * * *